(12) United States Patent
Dunipace (10) Patent No.: US 9,013,903 B2
(45) Date of Patent: Apr. 21, 2015

(54) HIGH SIDE DRIVER CIRCUITRY

(75) Inventor: Richard A. Dunipace, Highland Village, TX (US)

(73) Assignee: Fairchild Semiconductor Corporation, San Jose, CA (US)

( * ) Notice: Subject to any disclaimer, the term of this patent is extended or adjusted under 35 U.S.C. 154(b) by 136 days.

(21) Appl. No.: 13/368,139

(22) Filed: Feb. 7, 2012

(65) Prior Publication Data

US 2013/0200867 A1 Aug. 8, 2013

(51) Int. Cl.
*H02M 7/00* (2006.01)
*H03K 17/0412* (2006.01)
*H02M 1/08* (2006.01)

(52) U.S. Cl.
CPC .......... *H03K 17/0412* (2013.01); *H02M 1/08* (2013.01); *H03K 2217/0063* (2013.01)

(58) Field of Classification Search
USPC ......... 363/73, 21.18; 323/282, 283, 223, 289, 323/277, 222, 284, 901; 327/103, 108, 109
See application file for complete search history.

(56) References Cited

U.S. PATENT DOCUMENTS

| | | | |
|---|---|---|---|
| 5,343,170 A * | 8/1994 | Lee ............................. | 331/132 |
| 5,910,709 A * | 6/1999 | Stevanovic et al. ............. | 315/225 |
| 7,518,348 B1 * | 4/2009 | Kobayashi ..................... | 323/282 |
| 7,843,178 B1 * | 11/2010 | Houk et al. .................... | 323/222 |
| 8,130,520 B2 | 3/2012 | Ayukawa et al. | |
| 2009/0231319 A1 * | 9/2009 | Tsuchi ........................... | 345/211 |
| 2012/0068740 A1 * | 3/2012 | Sogabe et al. ................ | 327/110 |

FOREIGN PATENT DOCUMENTS

CN 101557166 10/2009

OTHER PUBLICATIONS

Wiley Electrical Electronics Engineering Dictionary. Steven M. Kaplan, 2004, IEEE, Press, p. 21.*
FAN73711 High-Current, High-Side Gate Drive IC, Fairchild Semiconductor Corporation, Jun. 2009, 11 pages, Rev. 1.0.0.
FAN7361, FAN7362 High-Side Gate Driver, Fairchild Semiconductor Corporation, Nov. 2009, 9 pages, Rev. 1.0.8.

* cited by examiner

*Primary Examiner* — Matthew Nguyen
*Assistant Examiner* — Trinh Dang
(74) *Attorney, Agent, or Firm* — Grossman Tucker Perreault & Pfleger PLLC (57) ABSTRACT

One embodiment of the present disclosure provides a method for controlling a power switch that includes converting a control signal to a current pulse signal, where the control signal is referenced to a first reference potential. The method also includes generating a switch drive voltage signal based on the current pulse signal, where the switch drive signal is referenced to a second reference potential. The method also includes controlling the conduction state of a power switch using the switch drive voltage.

14 Claims, 5 Drawing Sheets

HIGH SIDE DRIVER CIRCUITRY

FIELD

The present disclosure relates to driver circuitry for switched power supplies, motor drivers, and/or other devices requiring power switch control, and more particularly, to drive high side driver circuitry for power switches.

BACKGROUND

Many power switch applications require a switch that can function on the high-side of a high input voltage (e.g., on the order of 800 Volts or more) and can supply a valid switch closure when switching a DC voltage that varies from ground to the maximum input voltage at the full switching frequency. Such applications include: high-speed plasma drivers, high-speed gate drivers, switching mode power supplies, motor drivers, etc.

Several types of power switch drivers are known, for example, transformer coupled, DC coupled, opto-isolated with floating power supplies, etc. Each of these switch driving methods has benefits and drawbacks, but the DC coupled driver is among the simplest, lowest cost, and generally highest performance of the known driver topologies. In recent years, the voltages at which MOSFET and IGBT devices can run increased dramatically, along with the need at which the switch drivers can run. However, the DC coupled driver has not kept pace in terms of ability to operate at high input voltages and high speed.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides circuits, systems and methods for generating a switch drive control signal, which may be used, for example, with a high voltage switched power supply. It may also be used as a wide input voltage range switch driver for motor drivers, or other devices requiring a general purpose high side switch. The present disclosure provides various drivers to convert a conventionally modulated (e.g., PWM), or unmodulated, voltage control signal to a current pulse signal. The control signal may be referenced to a first reference potential. In turn, the current pulse signal is converted to a voltage switch control signal which is used to control the conduction state of a power switch. The voltage control signal may be referenced to a second reference potential. In some embodiments, the first and second reference potentials may be distinct and/or independent, and in some embodiments, the second reference potential may be dynamically changing (e.g., floating) based on, for example a power supply and/or high voltage rail. Since the current pulse signal is not necessarily referenced to system ground, the subsequent voltage switch control signal may remain isolated from the high voltage switching effects, while still providing high speed switching of a high voltage supply or other device requiring a wide operating voltage range.

Figure 1:
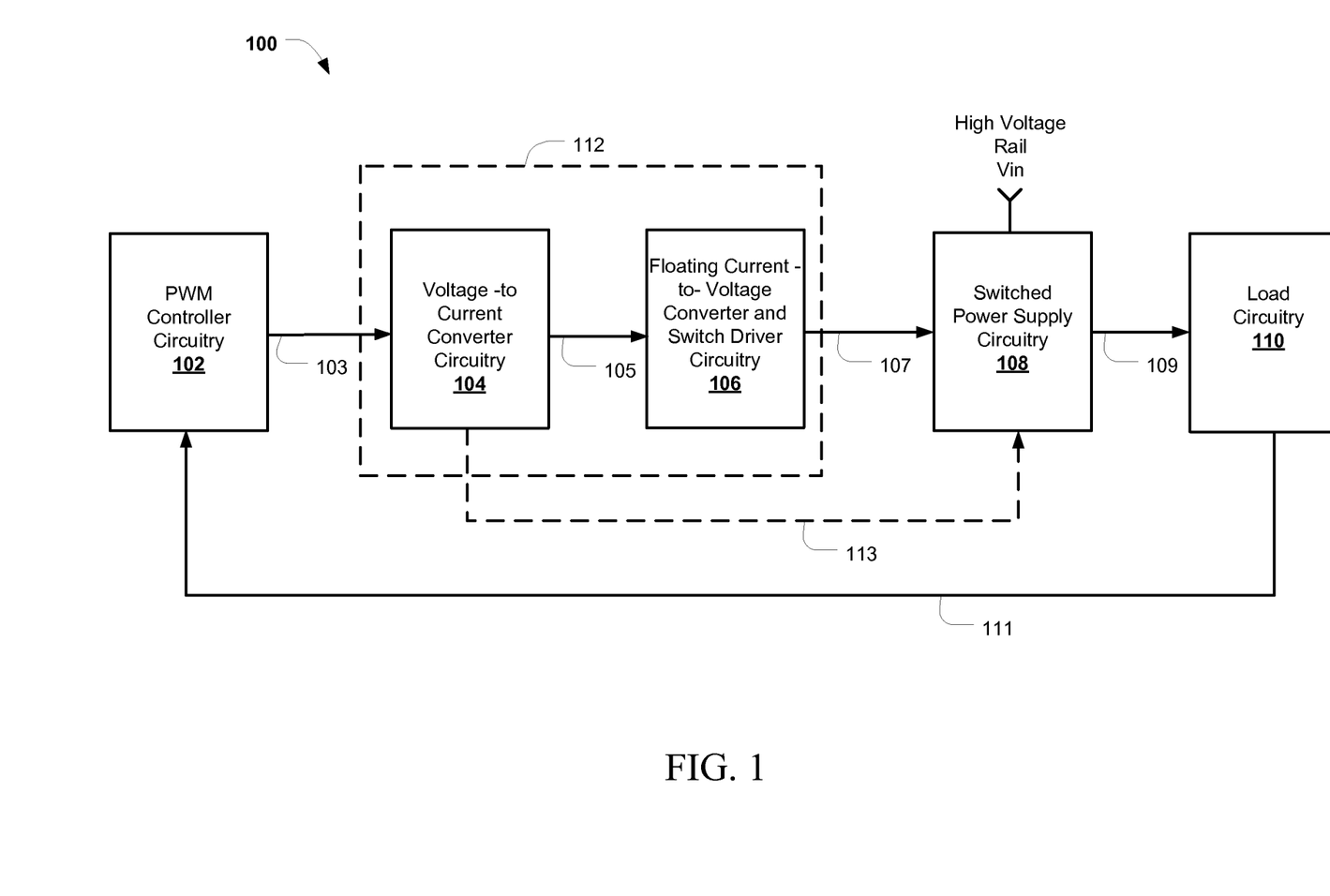
FIG. 1 illustrates a block diagram of a power supply system consistent with various embodiments of the present disclosure.

FIG. 1 illustrates a block diagram of a power supply system 100 consistent with various embodiments of the present disclosure. In general, the system 100 of FIG. 1 includes pulse width modulation (PWM) circuitry 102 that is configured to generate a controllable PWM signal 103, driver circuitry 112 that is configured to generate a switch driver signal 107, and switched power supply circuitry 108 that is configured to generate a controllable DC power supply 109 to load circuitry 110. The PWM circuitry 102 may be configured to receive a current or voltage feedback signal from the load circuitry 110 to adjust the duty cycle of the PWM signal 103 based on the requirements of the load circuitry 110. The PWM signal 103 generally is a voltage signal that swings from LOW to HIGH in reference to first reference potential (e.g., earth ground, chassis ground, etc.). In other embodiments, the PWM circuitry 102 may be replaced with pulse frequency modulation (PFM) circuitry, as is known in the art. In still other embodiments, other modulation schemes may be used. For example, in some control applications (e.g., motor, or other appliance), it may be desirable to utilize a control signal that does not have duty cycle limitations (e.g., simple on/off switching, etc.). Thus, while FIG. 1 specifically depicts control applications using PWM control signals, it is to be understood that the present disclosure is intended to have broad applicability with any control signal. Thus, "control signal" as used herein may include any type of modulated or unmodulated signal, and such control signal does not necessarily have associated duty cycle limitations.

The switched power supply circuitry 108 is generally configured to generate controlled power from a high voltage rail (Vin), which may be on the order of 400 Volts or more (e.g., 1.6 kV., etc). The switched power supply circuitry 108 may include any known or after-developed switched power supply topology, for example, single-switch DC-DC converter topologies that include a Buck converter, SEPIC, or double switch Boost converter, Flyback, etc. and/or multiple-switch DC-DC converter topologies that include bridge DC-DC converters, etc. Thus, the switched power supply circuitry 108 may include a single switch that is configured to switch between a ground or reference potential and Vin, and or multiple switches, for example a high side switch that is configured to switch between a ground or reference potential and Vin and a low side switch (e.g., a half bridge converter, etc.). To that end, the switch or switches of the switched power supply circuitry 108 may include, for example, MOSFET devices (e.g., PMOS, NMOS, etc.), IGBT devices, BJT devices, SiC (silicon on carbide) devices, etc., and/or any other type of known or after-developed high-voltage switch circuitry that is configured to controllably change conduction states. In one embodiment, the switch circuitry may include a series combination of BJT switch and an emitter switched MOSFET Cascode circuitry (which may include, for example, an ESBC™ switch (ESBC™ a trademark of Fairchild Semiconductor Corp.)).

Driver circuitry 112 is generally configured to receive a PWM signal 103 and generate a switch driver signal 107 to control the conduction state of one or more switches of the switched power supply circuitry. In the case of a single switch topology, the switch driver signal 107 is configured to control the conduction state of the switch between the high voltage input (Vin) and a reference potential, e.g., control of the high side switch. In the case of a multiple switch topology, switch driver signal 107 may be used to control the high side switch, and switch driver circuitry may also be configured to generate at least a second switch driver signal 113 to control, for example, the low side switch of a half bridge topology (e.g., signal 113 may be a complimentary PWM switch drive signal, as is well known in the art). Since the single switch or high side switch is responsible for switching in reference to Vin (which, in some embodiments is high voltage supply rail), the driver circuitry 112 is configured to convert the PWM signal to a current signal and to generate a switch drive signal 107 (voltage) that is floating with respect to a reference (ground) potential to enable the switch of the circuitry 108 to switch at a high frequency. Advantageously, the driver circuitry 112 can operate at high speeds exceeding, for example, 20 MHz with relatively short turn-on and turn-off delays of around 20 nS. The driver circuitry 112 can also operate to voltages exceeding 1600 volts, while conventional DC coupled drivers are limited to around 700 volts. Here, DC coupled means any type of electronic or photon coupling, as opposed to AC coupling and/or capacitive coupling, both of which can be duty cycle limited in operation. The voltage converter circuitry 104 also has very low output capacitance which reduces dv/dt switching errors.

In various embodiments described herein, the driver circuitry 112 may generally include voltage-to-current converter circuitry 104 that is configured to generate a current pulse signal 105 which, in some embodiments, is proportional to the frequency/duty cycle of the PWM signal 103. The driver circuitry also includes floating current-to-voltage converter and switch driver circuitry 106 that is configured to generate a voltage or current drive signal to control the conduction state of a power switch, for example, a power switch coupled to the high voltage rail Vin. The operation of the driver circuitry 112 will be described below in connection with various embodiments.

Figure 2:
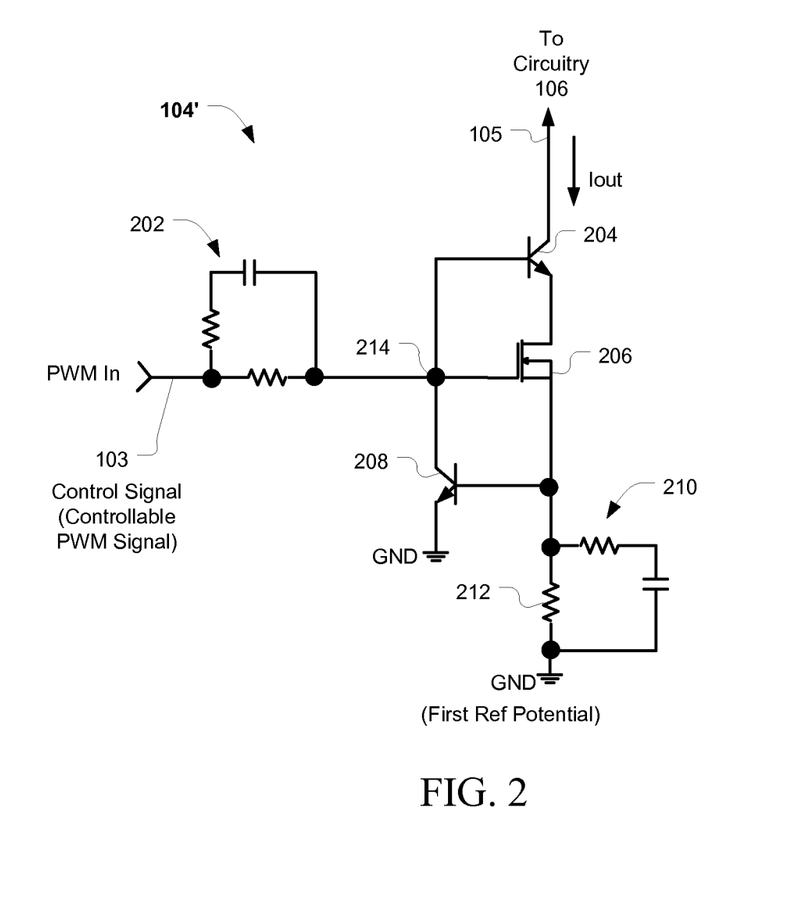
FIG. 2 illustrates voltage-to-current converter circuitry according to one embodiment of the present disclosure.

FIG. 2 illustrates voltage-to-current converter circuitry 104' according to one embodiment of the present disclosure. In general, circuitry 104' operates as a gated current sink to generate a current pulse signal 105 (Iout) based on the input PWM signal, or other control signal, 103 referenced to the first reference potential. The current pulse signal 105 is sinked from a positive power supply (e.g., Vcc, not shown in this Figure) associated with circuitry 106. Since the output 105 of circuitry 104' is a current signal, it is not referenced to the PWM input ground and therefore subsequent stages of the driver circuitry (described below) may operate in a floating state while still providing high voltage switching requirements. The circuitry of this embodiment includes an RC network 202 coupled to the input PWM signal 103. The RC network 202 speeds up turn-on and turn-off of circuitry 104. A first BJT transistor 204 is coupled between the output 105, a MOSFET transistor 206, and a BJT 208. The conduction state of transistors 204 and 206 are controlled by the input PWM signal 103. A second BJT transistor 208 is coupled between the PWM signal 103 at node 214 and the first reference potential (e.g., ground).

The conduction state of transistor 208 is controlled by the voltage across resistor 212. The voltage across resistor 212 is a product of Iout the resistance of resistor 212. RC network 210 operates to provide signal peaking during the leading edge of the PWM turn-on signal. This can be used to speed up the turn-on of the output current Iout, 105. Transistor 204 may be operated in a common base arrangement in Cascode with transistor 206. This configuration permits, for example, transistor 204 to operate to the Vcbo voltage without breakdown. In this arrangement, switching is performed by the MOSFET transistor 206 to improve switching speed. Transistor 204 isolates transistor 206 from the high speed voltage that may exists on the collector of transistor 204. Transistor 204 may also reduce or eliminate (via the Miller effect) capacitive feedback from the gate of transistor 206, thus increasing switching speed and lowering the load on the PWM controller 102.

In operation, when the PWM signal 103 is LOW, switches 204 and 206 are OFF (non-conducting), and thus, the sink current Iout is approximately 0 Amps. When the PWM signal 103 is HIGH, switch 206 turns ON which turns ON switch 204. This causes a current sink (Tout) through resistor 212. It should be understood that Tout is sourced from the current-to-voltage converter and switch driver circuitry 106. When the voltage drop across resistor 212 exceeds the ON threshold of transistor 208, transistor 208 turns ON. This operates to keep the voltage at node 214 from exceeding a predetermined amount. In other words, when transistor 208 turns ON, current is shunted from node 214 to GND through resistor 212, which produces a voltage drop across resistor 212. As the voltage at node 214 goes down, the conduction of transistors 204 and 206 are reduced which reduces Tout. Therefore transistor 208 operates to limit the current Tout that is sinked by the circuitry 104'.

The magnitude of the sink current Tout is generally controlled by the value of resistor 212 and the base-emitter voltage of transistor 208. As a general matter, the larger the current sink Tout, the greater the switching speed of the power supply at the expense of power loss. Thus, the value of resistor 212 may be chosen to satisfy switching speed and/or power loss requirements. Also, it should be noted that circuitry 104', advantageously, does not require a separate power supply to operate. In addition, the description of circuitry 104' is predicated on the use of NPN and N-channel transistors to sink current from the positive power supply (e.g. Vcc) associated with circuitry 106. In other embodiments, PNP and P-channel transistors may be used to source current from a negative power supply (e.g., Vdd) associated with circuitry 106.

Figure 3:
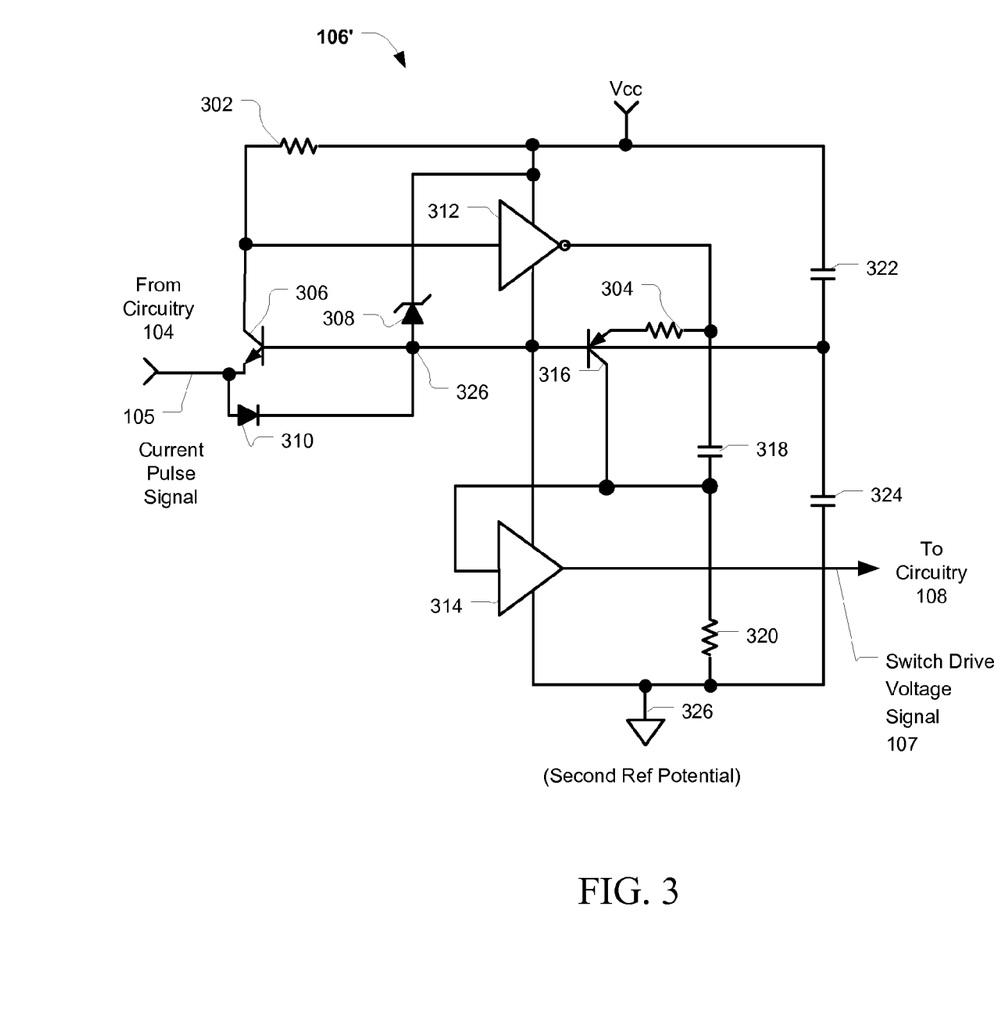
FIG. 3 illustrates current-to-voltage converter and switch driver circuitry according to one embodiment of the present disclosure.

FIG. 3 illustrates current-to-voltage converter and switch driver circuitry 106' according to one embodiment of the present disclosure. Circuitry 106' sources the current Iout from the circuitry 104', described above. Circuitry 106' generally includes inverting amplifier circuitry 312 and non-inverting amplifier circuitry 314 to generate the switch drive signal 107. Circuitry 106' is referenced to a second reference potential 326, which in some embodiments may be floating with respect to the first reference potential (FIG. 2). The circuitry 106' is coupled to power supply Vcc to provide power and operational voltages, as will be described below. In operation, when the PWM signal 103 is LOW (and Tout is approximately 0 Amps), BJT transistor 306 is OFF. Therefore, the input to amplifier 312 is Vcc (HIGH), and the output of amplifier 312 is LOW. Here "LOW" is Vcc minus the voltage drop across diode 308 (VD308), as observed at node 326. Thus, the HIGH to LOW swing of amplifier 312 is Vcc to Vcc−VD308. If the output of amplifier 312 is LOW, BJT transistor 316 is OFF, and therefore no current flows through resistor 304 because the base and emitter of transistor 316 are at the voltage of node 326 (i.e., Vcc−VD308). Thus, no current flows through resistor 320, and thus the switch drive signal 107 (output of amplifier 314) is LOW.

When the PWM signal 103 (and Iout is being generated), transistor 306 is turned ON (because the emitter is driven lower than the base, which is at Vcc−VD308). The majority of the current supplied by Vcc flows from the collector through the emitter of transistor 306, thus providing the source current to circuitry 104 (described above). This causes a voltage drop across resistor 302. If the voltage drop across resistor 302 is large enough, the input to amplifier 312 will be an equivalent LOW state, thus, the resistance value of resistor 302 may be chosen based on, for example, the input voltage requirements of amplifier 312 and the voltage value of Vcc less the diode drop of diode 308. When the input to amplifier 312 is LOW, the output is HIGH, which causes current to flow through resistor 304 and forward biases the emitter/base junction of transistor 316 to turn transistor 316 ON. When transistor 316 turns ON, the input to amplifier 314 is HIGH, and the switch drive signal 107 (output of amplifier 314) is HIGH.

The resistance value of resistor 304 may be chosen based on, for example, the turn on requirements of transistor 316, and to produce a valid logic HIGH for amplifier 314. Capacitor 318 couples the voltage change from LOW to HIGH to the input of buffer 314 to speed up switching. The voltage drop of diode 308 is chosen to provide the required voltage swing for the input of buffer 314. Capacitors 322 and C324 provide power supply bypassing and energy storage so that high-side driver 106 can be powered from an intermittent supply as might occur driving a MOSFET switch Buck converter. Circuitry 106' can be employed as a floating or fixed driver as required by the end user.

Figure 4:
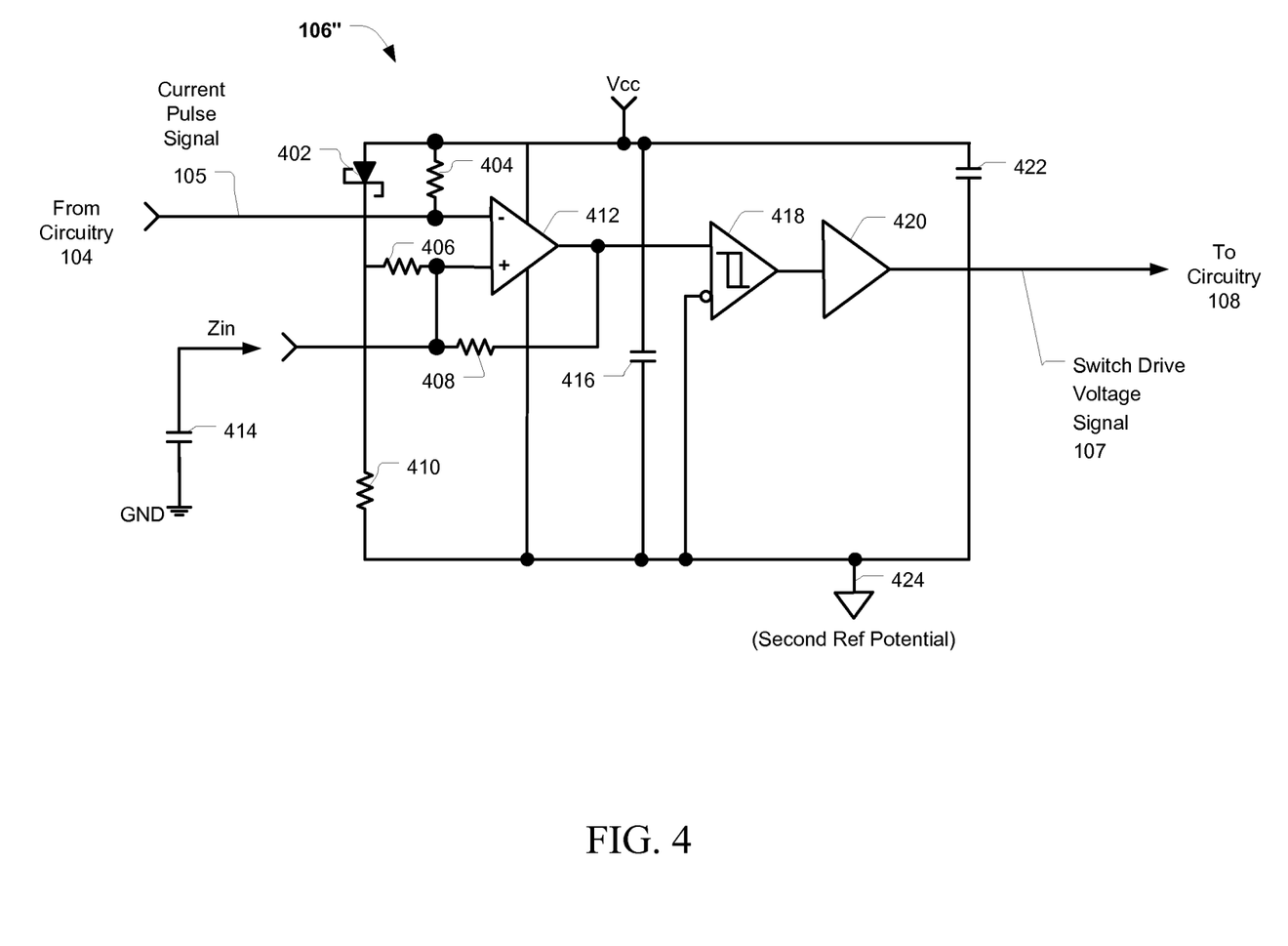
FIG. 4 illustrates current-to-voltage converter and switch driver circuitry according to another embodiment of the present disclosure.

FIG. 4 illustrates current-to-voltage converter and switch driver circuitry 106" according to another embodiment of the present disclosure. In this embodiment, comparator 412 provides common mode noise cancellation to permit reliable operation in the presence of relatively high dv/dt noise caused by high voltage switching. Also, circuitry 106" is referenced to a second reference potential 424, which in some embodiments may be floating with respect to the first reference potential (FIG. 2). Diode 402 is configured to provide a reference voltage of approximately 0.4 Volts referenced to the power supply input Vcc. Resistor 406 in association with resistor 408 scales the voltage drop across diode 402 and sets the amount of hysteresis at the positive input of comparator 412 during switching Resistor 408 is configured to provide positive feedback for comparator 412 to improve noise performance. Resistor 410 forward biases diode 402. Buffer 418 provides hysteresis to the output of comparator 412 to reduce noise, or jitter, at the output 107, and is used as an input buffer to drive buffer 420.

The resistances of resistors 408 and 406 may be adjusted to provide a nodal impedance at the positive input of comparator 412 close to that provided by resistor 404 on the negative input of comparator 412. The pulse current 105 has an associated capacitance relative to the chassis or system ground of the overall power supply. This capacitance produces a current flow and associated voltage drop across 404 if the output driver circuit 106 changes voltage relative to the system ground during the off to on, or on to off transition of the power supply power switch. This voltage drop on resistor 404 due to the capacitance is unwanted, and if large enough, could produce an input error to driver 106. To compensate for this, capacitor 414 can be tied to system ground to produce an identical voltage input to the positive input to comparator 412 assuming the parasitic capacitance of the PWM current 104 is the same as capacitor 414 that is tied to the positive input of comparator 412. The identical voltage inputs on comparator 412 due parasitic and compensating capacitance 414 act to cancel each other and reduce the possibility of dv/dt errors. Capacitors 416 and 422 provide power supply bypassing and energy storage for driver 106.

In operation, when the PWM signal 103 is LOW (and Iout is approximately 0 Amps), there is no voltage drop across resistor 404. The negative input of comparator 412 is approximately equal to Vcc and the positive input of comparator 412 is approximately −0.4 Volts referenced to Vcc (via diode 402 and resistors 406 and 408). Under these conditions, the output of comparator 412 is at ground (GND) level 424, and the input of comparator 420 is LOW as is the input to buffer 420. The output of buffer 420 is also low as is the output switch drive signal 107. When the PWM signal 103 is HIGH (and circuitry 106" is sourcing the current Iout), Iout generates a voltage drop across resistor 404 which drives the negative input of comparator 412 negative approximately 0.6 volts with respect to the positive input of comparator 412. This causes the output of comparator 412 to switch to the Vcc power supply (HIGH), and in turn, drives the output switch drive signal 107 of amplifier 420 to the Vcc power supply (HIGH).

Thus, the circuitry 106' and 106" of the embodiments of FIGS. 3 and 4 are configured to convert the current pulse signal 105 to a switch drive signal 107 having a floating reference (424). This enables, for example, high speed switching of the power supply circuitry 108 using a high voltage power supply (e.g., greater than 400 Volts), in addition to the other advantages described herein. In addition, the current pulse signal 105 is initially referenced to the power supply Vcc, which enables the generation of a voltage signal to drive various buffers. The voltage signal is then re-referenced to the floating reference e.g., reference potential 326, 424. It should be noted that, in some embodiments, re-referencing of the current pulse signal 105 may not be necessary or desirable._In other embodiment, the switch drive signal 107 may be used to control a power switch more generally to control the operation of a motor, or other circuit or device that is referenced at high voltage. In these applications, no PWM signal is required, rather simple on-off operation. In addition, in some embodiments the switch drive signal 107 may be a voltage signal (for example, to control MOSFET and/or IGBT type switch devices) or a current signal (for example, to control BJT and/or SiC type switch devices). Thus, while the switch drive signal 107 generated by the circuitry of FIGS. 3 and 4 is a voltage signal, those skilled in the art will recognize that additional circuitry may be present to convert the voltage switch drive signal to a current switch drive signal (via, for example a resistor, etc.).

Figure 5:
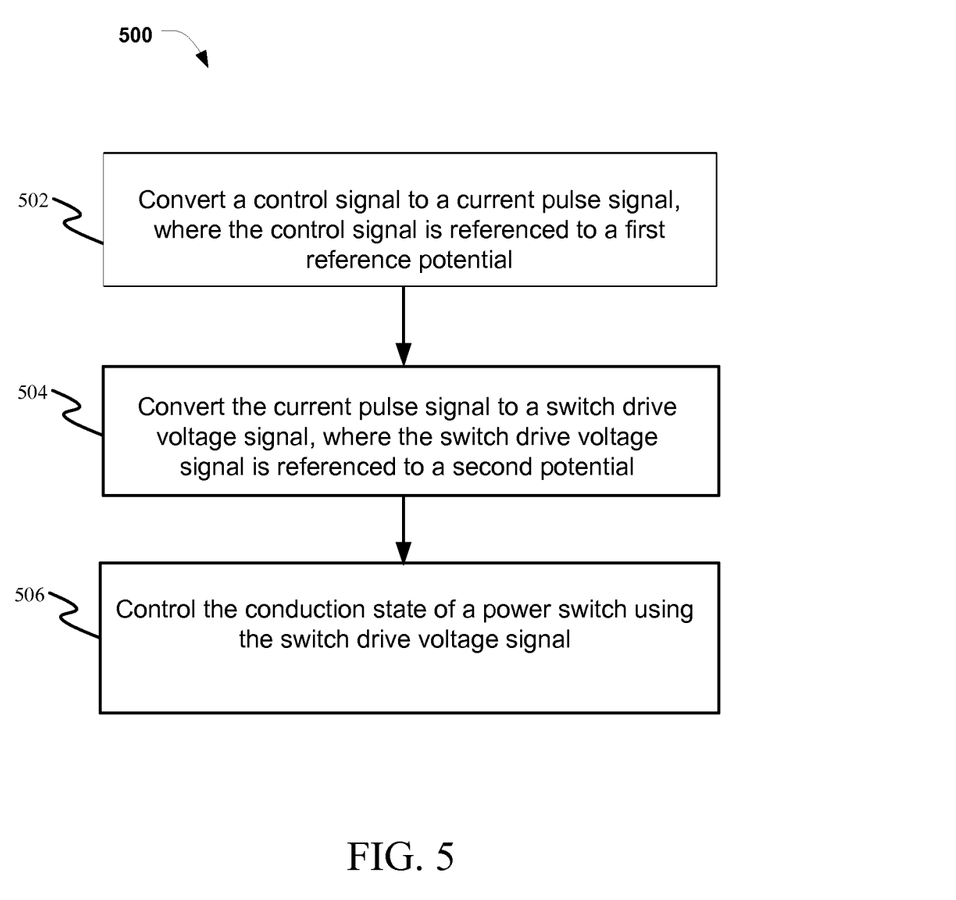
FIG. 5 illustrates a flowchart of operations of high voltage switch drive circuitry according to one exemplary embodiment consistent with the present disclosure.

FIG. 5 illustrates a flowchart of operations 500 of high side driver circuitry according to one exemplary embodiment consistent with the present disclosure. At operation 502, a control signal is converted to a current pulse signal, where the control signal is referenced to a first reference potential. At operation 504, a switch drive signal is generated, based on the current pulse signal, where the switch drive signal is referenced to a second reference potential. In some embodiments, the first reference potential may be fixed and the second reference potential may be floating. At operation 506, the switch drive voltage signal is used to control the conduction state of a power switch. The switch drive voltage signal may be floating with respect to a ground, or other reference, potential and/or fixed at a voltage positive to a system ground for the power supply.

"Circuitry", as used in any embodiment herein, may comprise, for example, singly or in any combination, hardwired circuitry, programmable circuitry, state machine circuitry, and/or firmware that stores instructions executed by programmable circuitry. The circuitry depicted in any of the embodiments described herein may be embodied as, or form part of, one or more integrated circuits and/or discreet circuit elements. An integrated circuit may include for example, a semiconductor integrated circuit chip. In any embodiment herein, it should be understood that any of the switches may include for example, MOSFET devices (e.g., PMOS, NMOS, etc.), IGBT devices, BJT devices, SiC (silicon on carbide) devices, etc., and/or any other type of known or after-developed switch circuitry (including high voltage switch circuitry) that is configured to controllably change conduction states.

Thus, in at least one embodiment the present disclosure provides switch driver circuitry that includes voltage-to-current converter circuitry configured to receive a control signal and configured to convert the control signal to a current pulse signal. The switch driver circuitry also includes current-to-voltage converter circuitry configured to generate a switch drive voltage signal based on the current pulse signal; wherein the switch drive voltage signal is configured to control the conduction state of a power switch.

In at least one other embodiment, the present disclosure provides a power supply system that includes pulse width modulation (PWM) controller circuitry configured to generate a controllable PWM signal and voltage-to-current converter circuitry configured to receive the PWM signal and configured to convert the PWM signal to a current pulse signal. The power supply also includes current-to-voltage converter circuitry configured to generate a switch drive voltage signal based on the current pulse signal and switched power supply circuitry comprising at least one power supply switch coupled to a high voltage power supply configured to generate a controllable power supply, wherein the switch drive voltage signal is configured to control the conduction state of a power supply switch coupled to the high voltage power supply.

In another embodiment, the present disclosure provides a method for controlling a power switch that includes converting a control signal to a current pulse signal, where the control signal is referenced to a first reference potential. The method also includes generating a switch drive voltage signal based on the current pulse signal, where the switch drive signal is referenced to a second reference potential. The method also includes controlling the conduction state of a power switch using the switch drive voltage signal.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A switch driver circuitry, comprising:
a voltage-to-current converter circuitry configured to receive a control signal referenced to a first reference potential and configured to convert the control signal to a current pulse signal, wherein the first reference potential is a ground potential;
a current-to-voltage converter circuitry configured to generate a switch drive voltage signal based on the current pulse signal;
wherein the voltage-to-current converter circuitry is further configured to sink the current pulse signal from the current-to-voltage converter circuitry;
wherein the switch drive voltage signal is referenced to a second reference potential that is floating with respect to the first reference potential;
wherein the switch drive voltage signal is configured to control the conduction state of a power switch; and
wherein the voltage-to-current converter circuitry comprises a bi-polar junction transistor (BJT) coupled to a metal oxide semiconductor transistor (MOS) in a Cascode arrangement; wherein the BJT is also coupled to the current-to-voltage converter circuitry; and wherein the control signal is configured to control the conduction state of the BJT and MOS transistors to generate the current pulse signal.

2. The switch driver circuitry of claim 1, wherein, the voltage-to-current converter circuitry comprises current limiting circuitry configured to limit the amperage of the current pulse signal.

3. The switch driver circuitry of claim 1, wherein the current-to-voltage circuitry is further configured to source current for the current pulse signal.

4. The switch driver circuitry of claim 1, wherein the first reference potential is a ground potential and the second reference potential is floating with respect to the first reference potential.

5. The switch driver circuitry of claim 1, wherein the power switch is coupled to a high voltage power supply having a DC voltage of 700 Volts or greater.

6. The switch driver circuitry of claim 1, wherein the power switch is coupled to a power supply, wherein the power supply has a range of operation from a voltage below the first reference potential to 400 Volts or greater.

7. The switch driver circuitry of claim 1, wherein the control signal is a pulse width modulation (PWM) signal and the switch drive voltage signal is a floating PWM switch drive voltage signal.

8. A power supply system, comprising:
a pulse width modulation (PWM) controller circuitry configured to generate a controllable PWM signal referenced to a first reference potential, wherein the first reference potential is a ground potential;
a voltage-to-current converter circuitry configured to receive the PWM signal and configured to convert the PWM signal to a current pulse signal;
a current-to-voltage converter circuitry configured to generate a switch drive voltage signal based on the current pulse signal; wherein the switch drive voltage signal is referenced to a second reference potential that is floating with respect to the first reference potential;
a switched power supply circuitry comprising at least one power supply switch coupled to a high voltage power supply configured to generate a controllable power supply, wherein the switch drive voltage signal is configured to control the conduction state of a power supply switch coupled to the high voltage power supply;
wherein the voltage-to-current converter circuitry is further configured to sink the current pulse signal from the current-to-voltage converter circuitry; and
wherein the voltage-to-current converter circuitry comprises a bi-polar junction transistor (BJT) coupled to a metal oxide semiconductor transistor (MOS) in a Cascode arrangement; wherein the BJT is also coupled to the current-to-voltage converter circuitry; and wherein the PWM signal is configured to control the conduction state of the BJT and MOS transistors to generate the current pulse signal.

9. The power supply system of claim 8, wherein, the voltage-to-current converter circuitry comprises current limiting circuitry configured to limit the amperage of the current pulse signal.

10. The power supply system of claim 8, wherein the current-to-voltage circuitry is further configured to source current for the current pulse signal.

11. The power supply system of claim 8, wherein the high voltage power supply is a power supply having a DC voltage of 700 Volts or greater.

12. The power supply system of claim 8, wherein the switched power supply circuitry is selected from the group comprising bridge, Buck, double-ended forward converter, boost or double-ended flyback power supply topologies or other power supply supply topologies requiring a high-side driver.

13. A switch driver circuitry, comprising:
a voltage-to-current converter circuitry configured to receive a control signal referenced to a first reference potential and configured to convert the control signal to a current pulse signal;
a current-to-voltage converter circuitry configured to generate a switch drive voltage signal based on the current pulse signal; wherein the switch drive voltage signal is referenced to a second reference potential; and wherein the switch drive voltage signal is configured to control the conduction state of a power switch;
wherein the voltage-to-current converter circuitry comprises a bi-polar junction transistor (BJT) coupled to a metal oxide semiconductor transistor (MOS) in a Cascode arrangement; and
wherein the BJT is also coupled to the current-to-voltage converter circuitry; and wherein the control signal is configured to control the conduction state of the BJT and MOS transistors to generate the current pulse signal.

14. A power supply system, comprising:
a pulse width modulation (PWM) controller circuitry configured to generate a controllable PWM signal referenced to a first reference potential;
a voltage-to-current converter circuitry configured to receive the PWM signal and configured to convert the PWM signal to a current pulse signal;
a current-to-voltage converter circuitry configured to generate a switch drive voltage signal based on the current pulse signal; wherein the switch drive voltage signal is referenced to a second reference potential; and
a switched power supply circuitry comprising at least one power supply switch coupled to a high voltage power supply configured to generate a controllable power supply, wherein the switch drive voltage signal is configured to control the conduction state of a power supply switch coupled to the high voltage power supply; and
wherein the voltage-to-current converter circuitry comprises a bi-polar junction transistor (BJT) coupled to a metal oxide semiconductor transistor (MOS) in a Cascode arrangement; wherein the BJT is also coupled to the current-to-voltage converter circuitry; and wherein the control signal is configured to control the conduction state of the BJT and MOS transistors to generate the current pulse signal.

* * * * *

UNITED STATES PATENT AND TRADEMARK OFFICE
CERTIFICATE OF CORRECTION

PATENT NO. : 9,013,903 B2  Page 1 of 1
APPLICATION NO. : 13/368139
DATED : April 21, 2015
INVENTOR(S) : Dunipace It is certified that error appears in the above-identified patent and that said Letters Patent is hereby corrected as shown below:

In the Claims

Column 9, line 20, Claim 12, delete "supply supply" and insert -- supply --, therefor.

Signed and Sealed this
Twenty-ninth Day of December, 2015

Michelle K. Lee
*Director of the United States Patent and Trademark Office*